(12) United States Patent
Hijzen

(10) Patent No.: US 7,485,534 B2
(45) Date of Patent: Feb. 3, 2009

(54) METHOD OF MANUFACTURE OF A TRENCH-GATE SEMICONDUCTOR DEVICE

(75) Inventor: Erwin A. Hijzen, Blanden (BE)

(73) Assignee: NXP B.V., Eindhoven (NL)

( * ) Notice: Subject to any disclaimer, the term of this patent is extended or adjusted under 35 U.S.C. 154(b) by 245 days.

(21) Appl. No.: 10/538,217

(22) PCT Filed: Dec. 8, 2003

(86) PCT No.: PCT/IB03/06025

§ 371 (c)(1),
(2), (4) Date: Jun. 9, 2005

(87) PCT Pub. No.: WO2004/055883

PCT Pub. Date: Jul. 1, 2004

(65) Prior Publication Data

US 2006/0024891 A1    Feb. 2, 2006

(30) Foreign Application Priority Data

Dec. 14, 2002 (GB) .................................. 0229212.6

(51) Int. Cl.
*H01L 21/336* (2006.01)
(52) U.S. Cl. ...................... 438/270; 438/272
(58) Field of Classification Search ................. 438/270, 438/272
See application file for complete search history.

(56) References Cited

U.S. PATENT DOCUMENTS

| | | | | |
|---|---|---|---|---|
| 4,028,149 A | * | 6/1977 | Deines et al. | 117/95 |
| 4,104,090 A | * | 8/1978 | Pogge | 438/409 |
| 4,459,181 A | * | 7/1984 | Benjamin | 205/124 |
| 4,541,001 A | * | 9/1985 | Schutten et al. | 257/331 |
| 4,612,465 A | * | 9/1986 | Schutten et al. | 327/434 |
| 4,643,804 A | * | 2/1987 | Lynch et al. | 205/50 |
| 4,992,390 A | * | 2/1991 | Chang | 438/270 |
| 5,164,325 A | * | 11/1992 | Cogan et al. | 438/270 |
| 6,198,127 B1 | * | 3/2001 | Kocon | 257/328 |
| 6,331,467 B1 | | 12/2001 | Brown et al. | |
| 6,444,528 B1 | | 9/2002 | Murphy | |
| 6,809,375 B2 | * | 10/2004 | Takemori et al. | 257/330 |

FOREIGN PATENT DOCUMENTS

EP    0205639    12/1986
WO    WO 0072372 A    11/2000

* cited by examiner

*Primary Examiner*—Mark Prenty
(74) *Attorney, Agent, or Firm*—Peter Zawilski

(57) ABSTRACT

A method of making a trench MOSFET includes forming a layer of porous silicon (26) at the bottom of a trench and then oxidizing the layer of porous silicon (26) to form a plug (30) at the bottom of the trench. This forms a thick oxide plug at the bottom of the trench thereby reducing capacitance between gate and drain.

13 Claims, 3 Drawing Sheets

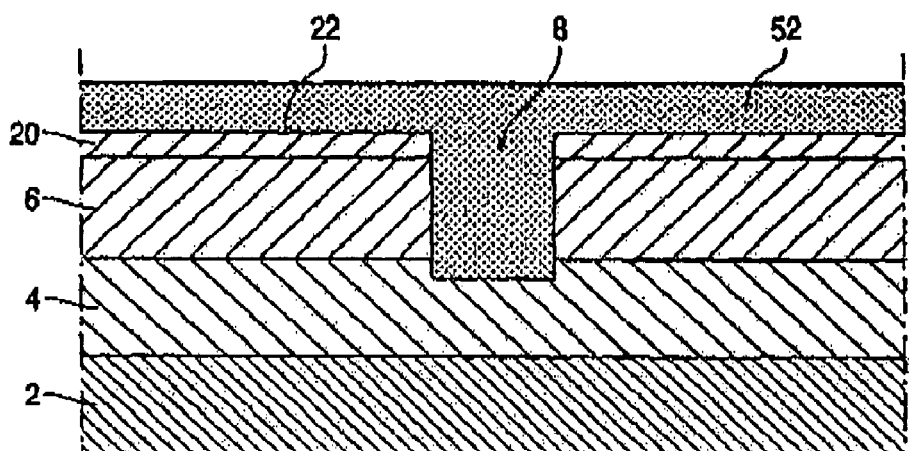
FIG.3a
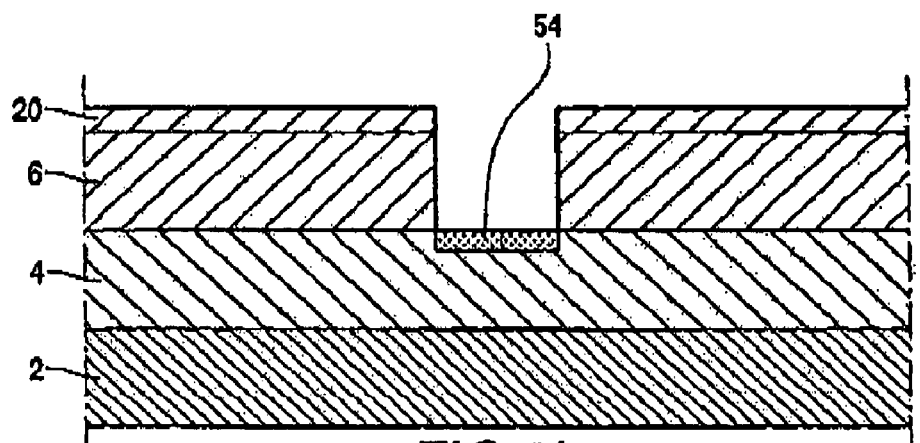
FIG.3b
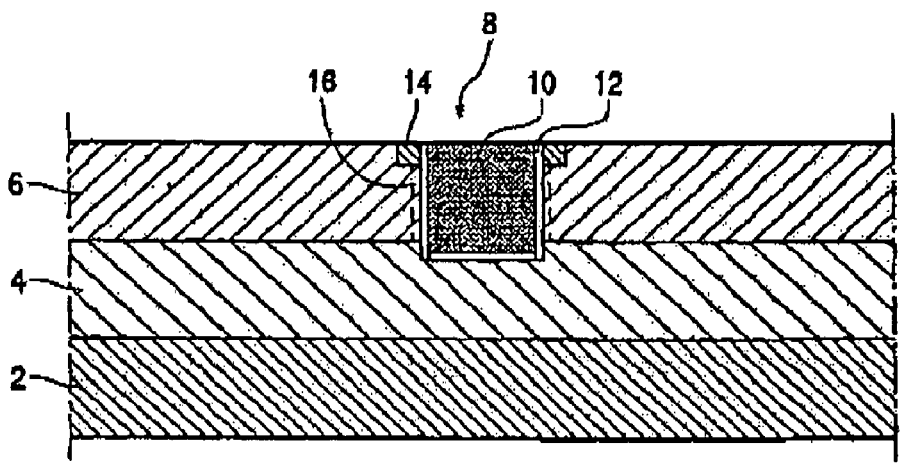
FIG.4-PRIOR ART

METHOD OF MANUFACTURE OF A TRENCH-GATE SEMICONDUCTOR DEVICE

The invention relates to the method of manufacture of a semiconductor device incorporating a trench, particularly a trench MOSFET (metal oxide semiconductor field effect transistor).

An example of a prior art trench semiconductor structure is illustrated in FIG. 4. An n-type drain layer 4 is provided over an n+ substrate 2, and a p-type body layer 6 is provided on the drain layer 4. A trench 8 extends through the body layer 6 as far as the drain layer 4, and includes a conductive gate 10 insulated from the body layer by a gate insulator 12. N+ source diffusions 14 are provided adjacent to the trench.

In use, a voltage is applied to the gate electrode to control a channel 16 extending in the body layer 6 adjacent to the trench 8 between the source 14 and drain 4.

Further details of prior art trench structures are provided in U.S. Pat. No. 6,331,467 to Brown et al, assigned to the US Philips Corporation which is incorporated herein by reference.

A problem with this structure is the capacitance between the gate and drain, since the gate at the bottom of the trench is very close to the drain. This capacitance can give rise to problems, and in particular to the Miller effect. The capacitance should therefore be minimised.

A known approach to reducing this capacitance is described in U.S. Pat. No. 6,444,528 to Murphy, which suggests providing a thicker insulator at the bottom of the trench. U.S. Pat. No. 6,444,528 describes forming a second trench at the bottom of the trench and growing selective oxide in the second trench to form this thicker insulator.

However, this approach is complex to manufacture and there is accordingly a need for a simpler approach to manufacturing such structures.

According to the invention there is provided a method of manufacturing a trench gate semiconductor device comprising the steps of: providing a silicon device body having a first major surface, the silicon device body having a drain region of a first conductivity type and a body region over the drain region; forming a trench extending downwards into the silicon device body from the first major surface, the trench having sidewalls and a base; etching the silicon at the base of the trench to form porous silicon at the base of the trench; and thermally oxidising the device to oxidise the porous silicon at the bottom of the trench to form a plug at the base of the trench; and depositing conductive material within the trench to form a gate.

By forming porous silicon in the bottom of the trench and then oxidising it a thick region at the bottom of the trench can be readily formed. This in turn can greatly reduce the gate-drain capacitance and hence the Miller effect. The approach according to the invention is relatively straightforward to manufacture.

Preferably, the step of etching the bottom of the trench to form porous silicon includes dry-etching the bottom of the trench through the same mask used to define the trench. The porosity of the silicon can be controlled by changing the etch chemistry.

Alternatively, the step of etching can include wet-etching.

The side walls of the trench may be provided with a dielectric liner for preventing the side walls becoming porous. This may be particularly useful when a wet etch is used. The liner may be oxide, or alternatively may be nitride or any other suitable layer. After formation the dielectric liner may be opened at the bottom of the trench, i.e. etched away from the bottom of the trench leaving the porous silicon exposed, leaving the dielectric liner on the sidewalls.

A particular benefit of a nitride liner is that it prevents oxidation of the sidewalls. This prevents narrowing of the trench during the oxidation step and so reduces the required trench width.

The oxidation step forming the thick oxide at the bottom of the trench may also form oxide on the side walls. In one embodiment, this oxide on the side walls is used as the gate oxide.

In alternative embodiments, the side wall oxide may be etched away. It is relatively straightforward to etch away the thin oxide formed on the side walls in the thermal oxidation step leaving the bulk of the thick oxide at the bottom of the trench. Where a suitable liner is used, such as nitride, there may be no oxide formed on the sidewall. In this case, the liner may be etched away.

After removing the liner and/or side wall oxide, gate oxide may be formed by thermal oxidation in a conventional manner.

Following the step or steps of forming the oxide at the bottom of the trench and the gate oxide the trench may be filled with doped polysilicon to form a gate.

In another aspect, there is provided a trench MOSFET comprising: a drain region of first conductivity type; a body region over the drain region; a trench extending from a first major surface through the body region; source regions of the first conductivity type laterally adjacent to the trench at the first major surface; thermal gate oxide on the side walls of the trench; a gate electrode in the trench insulated from the body region by the gate oxide; characterised by a thick oxide plug formed of oxidised porous silicon at the base of the trench extending into the drain region.

As explained above, such a structure is relatively straightforward to manufacture and exhibits a reduced Miller effect.

For a better understanding of the invention, embodiments will now be described, purely by way of example with reference to the accompanying drawings in which:

FIGS. 3a and 3b shows an alternative step in a method of manufacturing a semiconductor device according to a third embodiment of the invention; and FIG. 4 shows a prior art method of manufacturing a semiconductor device.

Like components are given the same reference numerals in the different figures. The drawings are not to scale. In this specification where terms such as "over" and "downwards" are used, these are intended to be relative to the device.

Figure 1A:
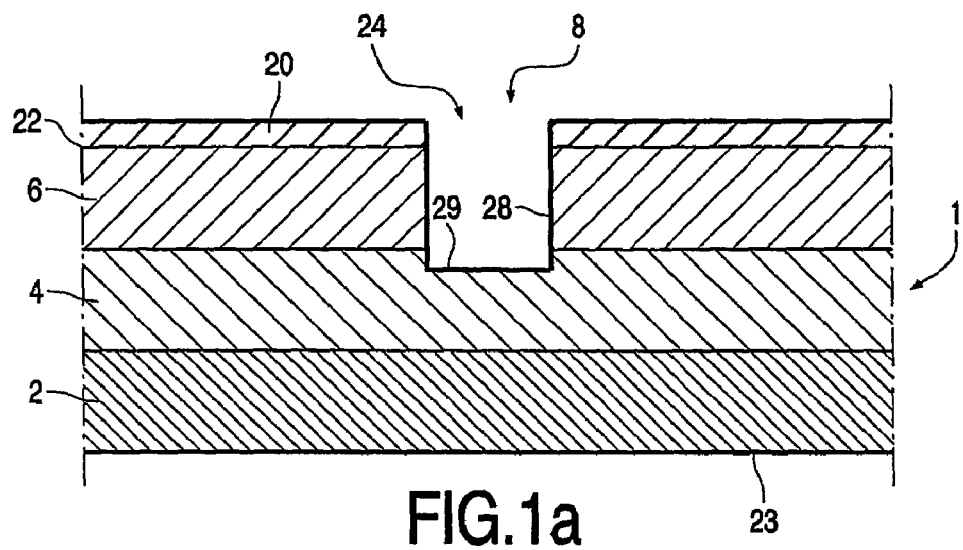
FIGS. 1a to 1e show steps in a method of manufacturing a semiconductor device according to a first embodiment the invention.

Referring to FIG. 1a, an n- type epilayer 4 is grown on an n+ type semiconductor substrate 2. A low doped p- body layer 6 is then formed on the epilayer 4, for example by ion implantation. Alternatively, the ion implantation step to form layer 6 may be carried out after the formation of the trench, or the layer 6 may also be grown epitaxially. This structure will be known as the "silicon device body" 1 in the following—the term is not intended to refer to just the body layer 6. The silicon device body has opposed first 22 and second 23 major surfaces.

Hard mask 20 is then formed by depositing oxide layer 20 on the first major surface 22 of the silicon device and patterning the oxide layer 20 to have an opening 24. Trench 8 is then etched through the opening into the n– layer 4. This trench etch may be carried out by any known process. The trench has sidewalls 28 and a base 29.

Figure 1B:
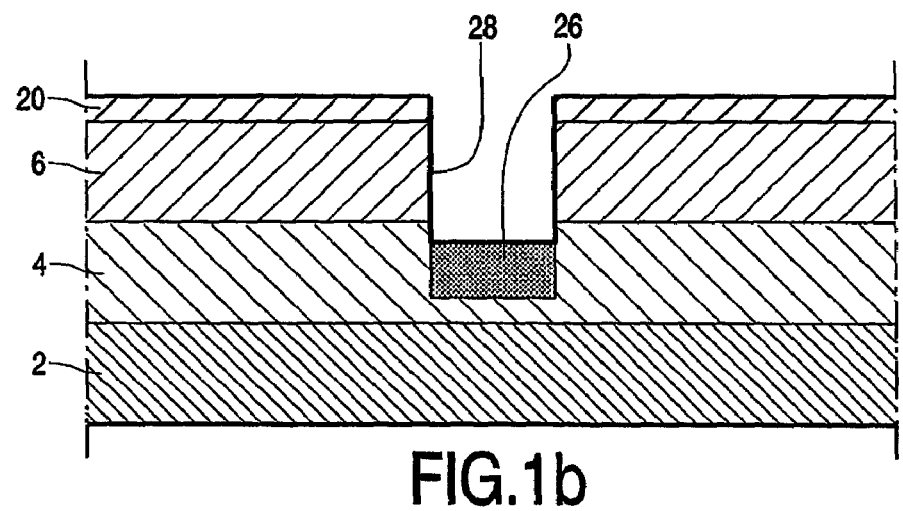

The next step is to form a plug of porous silicon 26 at the bottom of the trench 8. The porous silicon is formed from the silicon at the bottom of the trench by etching using a dry etch in a manner known to those skilled in the art. The porosity of the porous silicon can be controlled by changing the etch chemistry. FIG. 1b shows the trench with the porous silicon plug 26.

In an alternative etch process, a wet etch may be used. This is particularly suitable for p-type devices.

Figure 1C:
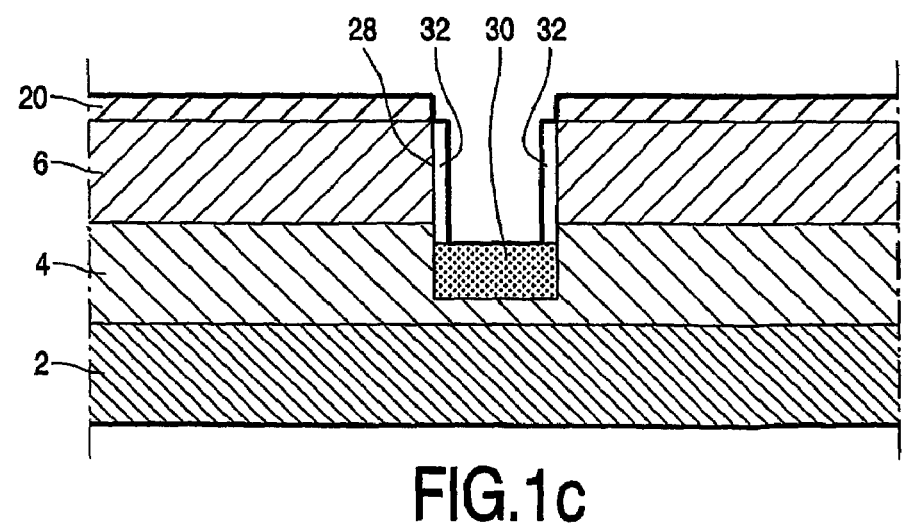

As illustrated in FIG. 1c, conventional thermal oxidation is then carried out to oxidize the porous silicon 26 to form an oxide plug 30 at the base of the trench. At the same time, oxide 32 is formed on the side wall 28 of the trench. Porous silicon can be fully oxidized without forming an excessive thickness of oxide 32 on the side walls 28. Thus, the oxide plug 30 at the bottom of the trench is much thicker than the oxide 32 on the side walls.

Optionally, the oxide 32 may be removed by a brief etch process and a second thermal oxidation step carried out to form gate oxide 12 on the side walls 28 of the trench in place of oxide layer 32. This will be necessary if oxide layer 32 does not have the required thickness to act as a gate oxide, and allows the process parameters for forming the oxide plug 30 to be optimised for oxidising porous silicon and the process parameters for forming the gate oxide layer 12 to be separately optimised for forming gate oxide. Otherwise, oxide 32 forms gate oxide 12.

In alternative embodiments with a dielectric liner, especially with a nitride dielectric liner, the liner may prevent oxidation of the sidewalls so the oxide 32 will be absent. In this case, the dielectric liner may be etched away and then gate oxide 12 formed on the sidewalls in the conventional manner.

Figure 1D:
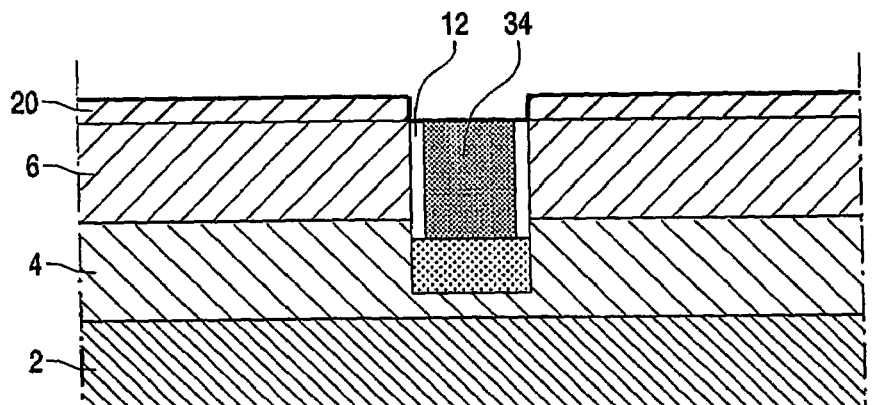

The next step is to fill the trench with polysilicon 34 acting as a gate, giving rise to the structure shown in FIG. 1d.

Figure 1E:
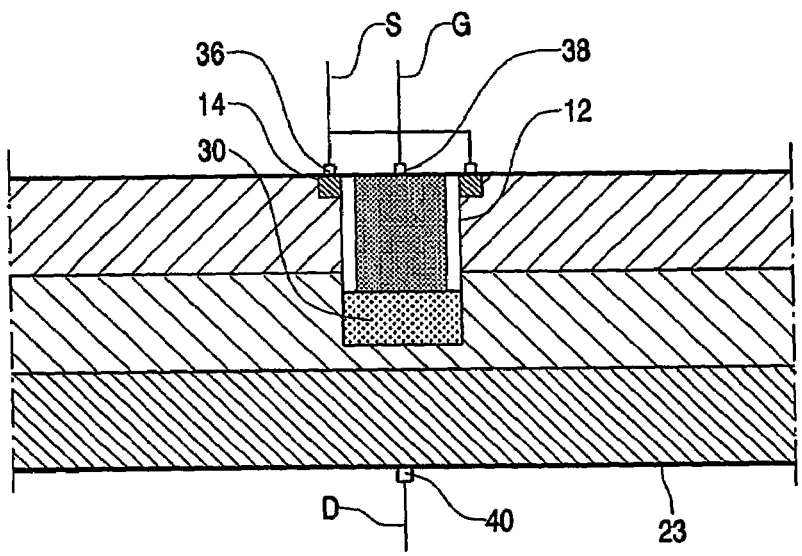

The remainder of the processing can be carried out in a conventional manner, as is well known to the man skilled in the art, to result in a device schematically illustrated in FIG. 1e. A source diffusion 14 is implanted at the first major surface at the lateral edges of the trench.

Source 36, gate 38 and drain 40 contacts are formed. They are schematically illustrated in FIG. 1e, the drain contact 40 being in this example a back contact on the second major surface 23. The source contact 36 contacts the n+ source diffusion 14.

The semiconductor is then packaged and contacted to form the finished semiconductor device as is known.

This process provides a ready means of manufacturing a trench MOSFET with a thick oxide plug at the bottom of the trench to reduce capacitance between the gate 10 and the drain 4.

A second embodiment of a method of manufacture is illustrated with reference to FIG. 2. In this alternative, a dielectric liner 50 is formed on the sidewalls 28 and base 29 of the trench after the trench is formed. In the embodiment described, the dielectric liner 50 is deposited nitride, but alternatively the dielectric liner may be any suitable dielectric layer, such as oxide or nitride, and may be formed, for example, by oxidation or deposition.

Figure 2:
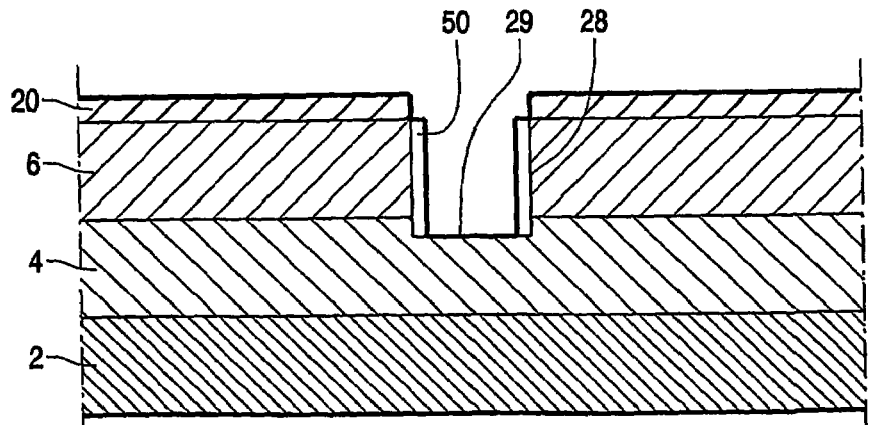
FIG. 2 shows an alternative step in a method of manufacturing a semiconductor device according to a second embodiment of the invention.

Next, the liner 50 is opened at the base of the trench to expose the silicon at the base 29 of the trench leaving the liner on the sidewalls, as illustrated in FIG. 2.

Following this, porous silicon is formed at the base of the trench and oxidised as described above with respect to the first embodiment. The nitride liner 50 prevents oxidation of the sidewalls 28. The dielectric liner 50 is etched away, thermal gate oxide 12 is formed on the walls, and a conductive gate material 34 deposited in the trench to result in an arrangement corresponding to that shown in FIG. 1d with a small amount of nitride liner 50 around the oxide plug 30. Processing then continues as set out with respect to the first embodiment.

In a still further embodiment, described with reference to FIG. 3, the porous silicon is formed, not by etching the body silicon at the base of the trench, but by etching deposited silicon. Thus, after the step of forming the trench as illustrated in FIG. 1, polysilicon 52 is deposited over the hard mask 20 and in the trench 8, as illustrated in FIG. 3a. Next, the polysilicon is etched back to leave a polysilicon plug 54 at the base of the trench as illustrated in FIG. 3b. Processing then continues as before by forming porous silicon 26 from the polysilicon plug resulting in the structure shown in FIG. 1b.

Further details of the processes used may be taken from the aforementioned U.S. Pat. No. 6,331,467. Other process options will be known to those skilled in the art, and these too may be adopted.

From reading the present disclosure, other variations and modifications will be apparent to persons skilled in the art. Such variations and modifications may involve equivalent and other features which are already known in the design, manufacture and use of trench semiconductor devices and which may be used in addition to or instead of features described herein. Although claims have been formulated in this application to particular combinations of features, it should be understood that the scope of disclosure also includes any novel feature or any novel combination of features disclosed herein either explicitly or implicitly or any generalisation thereof, whether or not it mitigates any or all of the same technical problems as does the present invention. The applicants hereby give notice that new claims may be formulated to any such features and/or combinations of such features during the prosecution of the present application or of any further applications derived therefrom.

For example, in the embodiment described the source diffusion 14 is formed after the trench 8. However, as the skilled person will realise, it is also possible to form the source diffusion 14 and then etch the trench through the source diffusion. Other variations in trench etch manufacturing may also be used.

The skilled person will realize that the invention may be used in a variety of different semiconductors structures. For example, although the epilayer 4 has been described as an n-epilayer, the body layer 6 as a p-type layer, and the source diffusion 14 as an n-doped region, any or all of these layers may be either p- or n type. A drift region, i.e. a low doped part of the drain epilayer 4 may be used, as is known. Other layers, diffusions and contacts may be included if required. The device may be p- or n- type.

The invention claimed is:

1. A method of manufacturing a trench gate semiconductor device comprising the steps of: providing a silicon device body having a first major surface, the silicon device body having a drain region of a first conductivity type and a body region over the drain region; forming a trench extending downwards into the silicon device body from the first major surface, the trench having sidewalls and a base; lining the sidewalls of the trench with dielectric liner; etching the silicon at the base of the trench to form porous silicon at the base of the trench, the dielectric liner formed on the sidewalls of trench preventing the sidewalls from also becoming porous; and thermally oxidizing the device to oxidize the porous silicon at the bottom of the trench to form a plug at the base of the trench; and depositing conductive material within the trench to form a gate.

2. A method of manufacturing a trench gate semiconductor device comprising the steps of:
   providing a silicon device body having a first major surface, the silicon device body having a drain region of a first conductivity type and a body region over the drain region;
   forming a trench extending downwards into the silicon device body from the first major surface, the trench having sidewalls and a base;
   etching the silicon at the base of the trench to form porous silicon at the base of the trench; and thermally oxidizing the device to oxidize the porous silicon at the bottom of the trench to form a plug at the base of the trench and to form sidewall oxide on the sidewalls of the trench;
   etching away the oxide formed on the sidewalls and forming a gate oxide by thermal oxidation on the sidewalls; and
   after the step of forming the gate oxide, depositing conductive material within the trench to form a gate.

3. A method according to claim 1 wherein the step of forming the trench includes providing a mask on the first major surface defining an opening and etching the trench extending downwards from the first major surface through the opening.

4. A method according to claim 3 wherein the mask is an oxide hard mask.

5. A method according to claim 3 wherein the step of etching the silicon at the bottom of the trench to form porous silicon includes dry-etching the bottom of the trench through the same mask used to define the trench.

6. A method of manufacturing a trench gate semiconductor device comprising the steps of:
   providing a silicon device body having a first major surface, the silicon device body having a drain region of a first conductivity type and a body region over the drain region;
   forming a trench extending downwards into the silicon device body from the first major surface, the trench having sidewalls and a base;
   depositing a silicon plug in the trench;
   etching the silicon at the base of the trench including the silicon plug to form porous silicon at the base of the trench;
   thermally oxidizing the device to oxidize the porous silicon at the bottom of the trench; and
   depositing conductive material within the trench to form a gate.

7. A method according to claim 1 further comprising forming a source implant of first conductivity type at the first major surface adjacent to the trench and forming source, gate and drain electrodes attached to the source implant, the gate and the drain region at the bottom of the trench respectively to complete the trench gate semiconductor device.

8. A method of manufacturing a trench gate semiconductor device, the method comprising:
   providing a silicon device body having a first major surface, the silicon device body having a drain region of a first conductivity type and a body region over the drain region;
   forming a trench extending downwards into the silicon device body from the first major surface, the trench having sidewalls and a base;
   lining the sidewalls of the trench with a dielectric liner;
   etching the silicon at the base of the trench to form porous silicon at the base of the trench, the dielectric liner formed on the sidewalls of trench preventing the sidewalls from also becoming porous;
   thermally oxidizing the device to oxidize the porous silicon at the base of the trench to form a plug at the base of the trench, wherein thermally oxidizing the device forms sidewall oxide on the sidewalls of the trench; and
   depositing conductive material within the trench to form a gate.

9. A method of manufacturing a trench gate semiconductor device, the method comprising:
   providing a silicon device body having a first major surface, the silicon device body having a drain region of a first conductivity type and a body region over the drain region;
   forming a trench extending downwards into the silicon device body from the first major surface, the trench having sidewalls and a base;
   etching the silicon at the base of the trench to form porous silicon at the base of the trench;
   thermally oxidizing the device to oxidize the porous silicon at the base of the trench to form a plug at the base of the trench, wherein thermally oxidizing the device forms sidewall oxide on the sidewalls of the trench;
   etching away the sidewall oxide and forming a gate oxide by thermal oxidation on the sidewalls of the trench; and
   after etching away the sidewall oxide, depositing conductive material within the trench to form a gate.

10. The method of claim 8, wherein forming the trench includes providing a mask having an opening and on the first major surface and etching through the opening.

11. The method of claim 10, wherein the mask is an oxide hard mask.

12. The method of claim 10, wherein etching the silicon at the base of the trench to form porous silicon includes dry-etching the base of the trench through the same mask used to define the trench.

13. The method of claim 10, further comprising forming a source implant of the first conductivity type at the first major surface adjacent to the trench and forming source, gate and drain electrodes attached to the source implant, the gate and the drain region at the bottom of the trench respectively.

* * * * *